United States Patent [19]

Fay et al.

[11] 4,311,389

[45] Jan. 19, 1982

[54] METHOD FOR THE OPTICAL ALIGNMENT OF DESIGNS IN TWO NEAR PLANES AND ALIGNMENT APPARATUS FOR PERFORMING THIS METHOD

[75] Inventors: Bernard Fay; Jacques Trotel; Alain Frichet, all of Paris, France

[73] Assignee: Thomson-CSF, Paris, France

[21] Appl. No.: 75,681

[22] Filed: Sep. 13, 1979

[30] Foreign Application Priority Data

Sep. 19, 1978 [FR] France ............... 78 26816

[51] Int. Cl.³ .................. G01B 9/02; G01B 11/00
[52] U.S. Cl. .................. 356/354; 250/237 G; 356/400
[58] Field of Search ............... 356/399–401, 356/395–396, 354–356; 250/237 G; 350/167 ZP

[56] References Cited

U.S. PATENT DOCUMENTS

| | | | |
|---|---|---|---|
| 3,690,881 | 9/1972 | King . | |
| 3,768,911 | 10/1973 | Erickson | 250/237 G |
| 3,783,520 | 1/1974 | King | 33/180 R |
| 3,867,038 | 2/1975 | Westell | 356/395 |
| 4,037,969 | 7/1977 | Feldman et al. | 356/401 |
| 4,113,388 | 9/1978 | Gates et al. | 356/356 |
| 4,153,367 | 5/1979 | Lietar et al. | 356/400 |

FOREIGN PATENT DOCUMENTS

| | | |
|---|---|---|
| 2052729 | 4/1971 | France . |
| 2062604 | 6/1971 | France . |
| 2379097 | 8/1978 | France . |
| 1145721 | 3/1969 | United Kingdom . |

OTHER PUBLICATIONS

King et al., "Photolithographic Mask Alignment Using Moire Techniques", Applied Optics, 11-1972, pp. 2455–2459.

Hermannsfeldt et al., "Precision Alignment Using a System of Large Rectangular Fresnel Lenses", Applied Optics, 6-1968, pp. 996–999.

Milaan, A. Van, "Eeen eenvoudige optische uitlijnmethode met een grote nauwkeurigheid", T.N.O-Niews, 4-1967, pp. 162–164.

*Primary Examiner*—William H. Punter
*Attorney, Agent, or Firm*—Cushman, Darby & Cushman

[57] ABSTRACT

The invention relates to the alignment of designs in two near planes, whereby one (the mask) carries a design which is to be reproduced on the second (the pattern).

The invention relates to a method for the optical alignment of these two planes using a pair of marks formed by a lens (4) having linear Fresnel zones inscribed on the mask (1) and a reflecting grating (3) of appropriate width inscribed on the pattern (2). The illumination by a parallel beam of monochromatic light of the lens with Fresnel zones produces on the pattern a substantially rectangular illumination spot which, when made to coincide with the line inscribed on the pattern is reflected or transmitted, and supplies a detected intensity maximum or minimum depending on whether the lines reflects more or less than the remainder of the pattern. The invention also relates to an optical alignment apparatus for performing this method.

The invention applies to the alignment of lithographic X-ray masks or photographic masks with respect to patterns on which reproduction is to take place.

4 Claims, 13 Drawing Figures

METHOD FOR THE OPTICAL ALIGNMENT OF DESIGNS IN TWO NEAR PLANES AND ALIGNMENT APPARATUS FOR PERFORMING THIS METHOD

BACKGROUND OF THE INVENTION

The invention relates to the production of circuits by microlithography and more specifically relates to a method for the optical alignment of masks and patterns located in close or near planes and the alignment apparatus used for performing this method.

In devices for reproducing designs on a pattern by exposure to X-radiation or light radiation through an appropriate mask located at a few micrometers from the pattern each operation requires a precise alignment of mask and pattern. To obtain this alignment with an accuracy of approximately 1/10th of a micrometer a number of alignment methods using the diffraction properties of light by gratings have been described, for example the Moiré fringes method or the methods of Torii and Smith. These methods comprise inscribing on the mask and on the pattern gratings having a predetermined spacing and detecting the radiation diffracted by these two gratings located in near planes.

The Moiré fringes method comprises inscribing on the mask and pattern two gratings with slightly different spacings. The combination of the different order of diffraction gives a fringes system whose spread increases in inverse proportion to the spacings of the gratings. The improvement in accuracy sought by this spatial amplification of the fringes is lost in coherent light by noise problems (speckle, interference, etc.) and in incoherent light by the poor contrast of the fringes.

The Torii method comprises inscribing complimentary gratings on the mask and on the pattern, each of the gratings having absorbent zones of width 1 and transparent zones of width 3×1. Illumination is by monochromatic light. The two gratings are intercalated when the alignment is performed. In the aligned position such a method makes it possible to detect one extremum in a given direction, but the position of this extremum is dependent on the spacing between the planes to be aligned.

Finally the Smith method comprises inscribing on both mask and pattern two gratings of the same spacing, illuminating by a monochromatic plane wave and measuring the intensity diffracted by the two gratings in the resulting symmetrical orders of diffraction (e.g. the resultant order +1 and the resultant order −1). The alignment of the two gratings is obtained when the two signals are equal. The disadvantage of this method is the high sensitivity with respect to spacing of the two planes and with respect to the symmetry of the gratings obtained.

All these methods leave an uncertainty due to the periodicity of the resultant signal and it is therefore necessary to remove this uncertainty by another method.

BRIEF SUMMARY OF THE INVENTION

The invention relates to a method for the alignment of two close planes and the alignment apparatus for performing this method, making it possible to obviate the disadvantages of the above-mentioned methods and in particular permitting a very accurate alignment of two close planes, whilst tolerating, without loss of alignment accuracy spacing variations between the two planes of a greater magnitude than those possible in the previously known alignment methods.

For this purpose a lens with linear Fresnel zones is inscribed on the mask and a line with the same or a greater width than the smallest Fresnel zone, inscribed on the mask, is inscribed on the pattern. The illumination of the mask by a parallel monochromatic light beam, e.g. a laser makes it possible to form on the pattern a rectangular illumination spot (focal spot) corresponding to the diffraction order +1 which on covering the line formed on the pattern leads to the detection of an illumination maximum or minimum of the radiation reflected by the pattern, depending on whether the line inscribed on the pattern is more reflecting or less reflecting than the zone which surrounds it.

BRIEF DESCRIPTION OF THE DRAWINGS

The invention will be described in greater detail hereinafter relative to non-limitative embodiments and the attached drawings, wherein show.

DETAILED DESCRIPTION OF THE PREFERRED EMBODIMENTS

Figure 1:
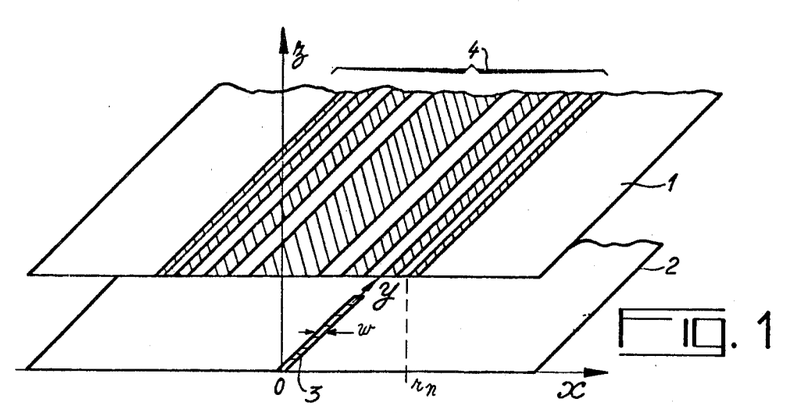
FIG. 1 an example of the designs inscribed on the mask and pattern for the alignment.

FIG. 1 diagrammatically shows the designs necessary for alignment purposes on mask 1 and pattern 2. Mask 1 carries a lens 4 having linear Fresnal zones formed by strips of unequal width distributed in accordance with a Fresnel distribution and alternately opaque and transparent. The central strip is shown as opaque, but the opposite arrangement (central strip transparent) is also possible. On an axis parallel to the alignment direction Ox and perpendicular to the direction Oy of the strips, the transitions between the strips have respectively for abscissas $r_n$ such as:

$$r_n^2 = nF\lambda + \frac{n^2\lambda^2}{4}$$

in which n is the strip number, F the desired focal length for the lens and $\lambda$ the wavelength of the monochromatic radiation illuminating this lens. This focal length F corresponding to the principal focus of order 1, whilst $F_1$ of the lens is chosen equal to the distance $r_n$ separating the two planes to be aligned, namely the plane of the mask and that of the pattern. This distance is of the order of 1/10th of a micrometer. Due to the lack of uniformity of the surfaces of the strips (the Fresnel zones being linear) the contribution of the different zones to the diffracted radiation decreases rapidly on moving away from the central strip. Thus, a lens formed from a relatively limited number of strips is sufficient to obtain a correct efficiency. In the extreme case the lens can be limited to a single zone, i.e. the central zone.

Figure 2:
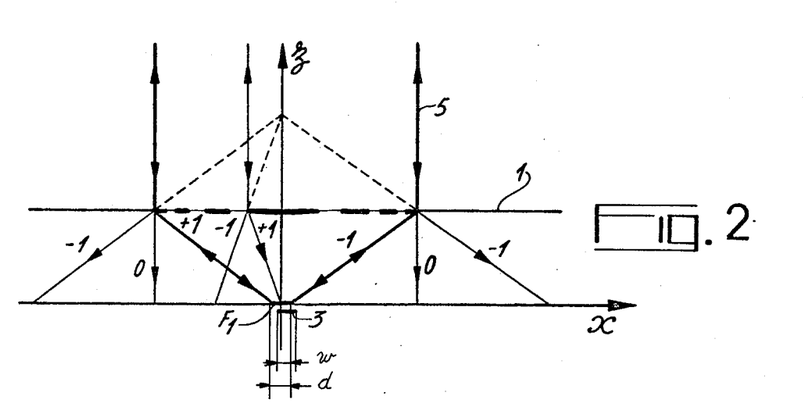
FIGS. 2 and 3 diagrams explaining the operation of the apparatus.

FIG. 2 shows a diagram in the plane xoz of the radiation diffracted by such a lens illuminated by a parallel beam 5. This lens transmits without diffracting (order 0) part of the radiation and diffracts another part of the radiation, whilst forming for a source at infinity real images corresponding to the orders $+1$, $+2$, etc. and virtual images corresponding to the orders $-1$, $-2$, etc. The orders 0, 1 and $-1$ are shown in FIG. 2. The illumination spot formed on the pattern, when the plane of the pattern is at a distance from the mask equal to the principal focal length (order $+1$) of the lens, is a strip whose width is approximately equal to the widths of the external strips of the lens with Fresnal zones. When the plane of the pattern is at a distance greater or smaller than the focal lens the order 1 is concentrated on the pattern in a slightly less wide and slightly less concentrated lighting spot, but which can still be used for obtaining alignment.

A line 3 having width w (also shown in FIG. 1) is made on pattern 2 and is either more reflecting or less reflecting than the zone which surrounds it. In both cases the radiation reflected by the substrate is usable to obtain the alignment. In the first case the detected reflected radiation passes through a maximum when the order 1 diffracted by the lens with linear Fresnel zones and the line are aligned and in the second case the detected reflected radiation passes through a minimum.

In order that alignment is obtained with a high degree of precision it is necessary for the width d of the illuminating spot to be substantially equal to the width w of the mark made on the pattern in such a way that there is a position in which all the radiation concentrated in the order 1 of the diffracted beam is reflected or absorbed and that an extremum is obtained which is relatively well contrasted with respect to the radiation permanently reflected by the pattern.

Figure 3:
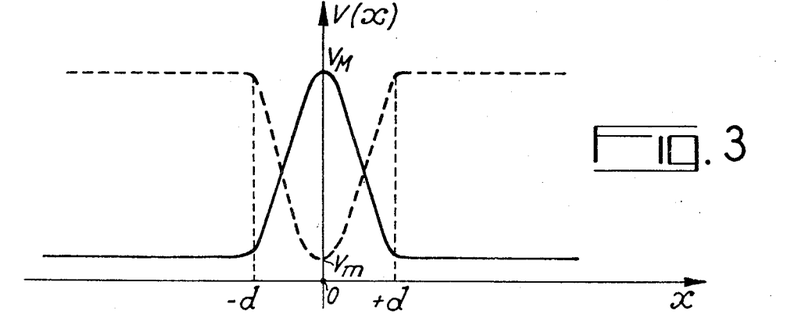

FIG. 3 shows an example of a detected signal V(x) for $w=d$, as a continuous line when the mark reflects and as a dotted line when the mark absorbs. The lens is moved with respect to the mark in accordance with the axis Ox, the extremum being $V_M$ or $V_m$ depending on whether the mark reflects or absorbs.

When the distance between the plane of the pattern and the plane of the mask varies around the principal focal length of the lens contrast decreases, but this distance is not critical and the setting can still be obtained. Moreover, it is possible to use variations in the signal maximum to carry out a fine setting of this distance to a predetermined value.

The radiation reflected by the pattern again passes through the lens with Fresnel zones and can be detected, after separation with respect to the incident radiation effected for example by a separating member. However, such a system leads to an interaction between the useful radiation and the radiation diffracted by the mask.

In order to obtain a special separation of the radiation reflected or diffracted by the mask and the return radiation emerging from the mask after reflection on the pattern it is possible to use a number of devices. The more these devices minimise the continuous background detected and the more they retain the symmetry of the system in such a way as to reduce the influence of certain parameters, e.g. spacing the better their performance.

Figure 4:
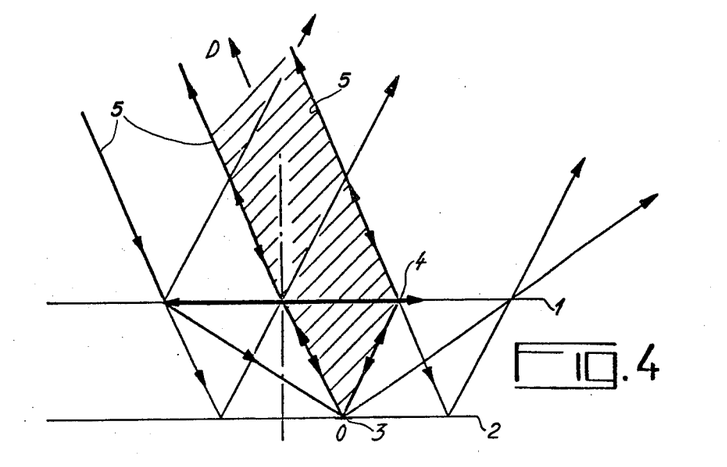
FIGS. 4, 5 and 6 examples of optical devices which can be used for separating the return radiation reflected by the pattern from the ambient radiation.
Figure 5:
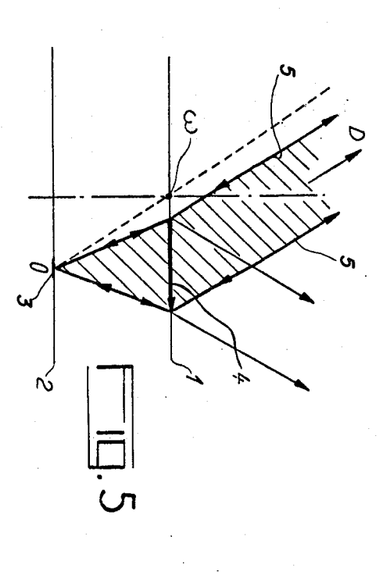
Figure 6:
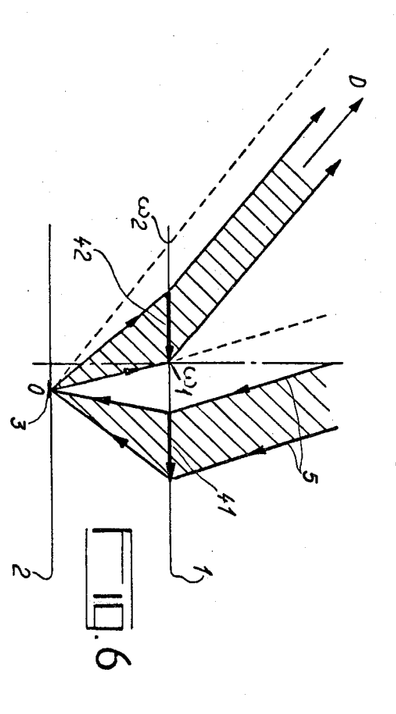

FIGS. 4, 5 and 6 diagrammatically illustrate three possible devices which can be used for preventing the interaction between the radiation to be detected and the radiation reflected or diffracted by the mask.

FIG. 4 shows solution which the parallel radiation 5 incident on the lens 4 having linear Fresnel zones has an oblique incidence on the said lens. The lens with Fresnel zones has been shown in the conventional manner for convergent lenses and the plane of mask 1. The radiation transmitted without diffraction (order 0) by the mask and the radiation reflected by the mask emerge obliquely with respect to the perpendicular direction to the mask. The convergent beam (order 1) diffracted by the mask is reflected by the line (in the case where said line reflects more than the surrounding zone) and emerges from the mask. Only the part of the radiation emerging from the mask after having retraversed lens 4 is detected in direction D in a zone not disturbed by the continuous background. Moreover the detected radiation does not interact with the radiation reflected or diffracted by the mask. In FIG. 4, reference numeral "3" denotes strip 3 shown in FIG. 1 and reference numeral "0" denotes the abscissa "0" shown in FIG. 1. Here, strip 3 is not situated on the focal axis of lens 4 when correct alignment is achieved.

FIG. 5 shows another optical device which can be used for measuring the intensity of the radiation reflected or diffracted by the line. In this device the lens with linear Fresnel zones is only used in part, its centre $\omega$ being located outside the oblique incident beam on said lens. This arrangement is similar to that of FIG. 4 as regards the effects obtained and involves the use of an incident beam of cross-section equal to the useful cross-section of the beam of FIG. 4 (hatched area in this drawing), but in this device the regulation of the spacing must be very precise to ensure that the return radiation passes through the lens.

FIG. 6 shows another optical device in which two coplanar half-lenses of the same focal distance and off-centred with respect to the optical axis of the incident radiation are used for the spatial separation of the different reflected or diffracted beams. These two half-lenses 41 and 42 of respective centre $\omega_1$ and $\omega_2$ are respectively used for focussing the incident beam on the pattern and for collimating the beam reflected by the line and detected in direction D. In FIG. 6, $\omega_1$ is the center of lens 41 and $\omega_2$ is the center of lens 42, which are both off-centered (as with the center W for lens 4 shown in FIG. 5).

The devices described with regard to FIGS. 4, 5 and 6 make it possible to obviate interaction between the radiation reflected or diffracted by the mask and the radiation to be detected reflected by the line and collimated by the lens. They also make it possible to minimise the continuous background in the detection direction. However, as a result of the oblique incidence of the radiation incident on the lens to obtain a maximum signal the distance between the two planes must be previously well regulated in such a way that the reflected radiation is indeed transmitted in the direction of the detection device.

Figure 7:
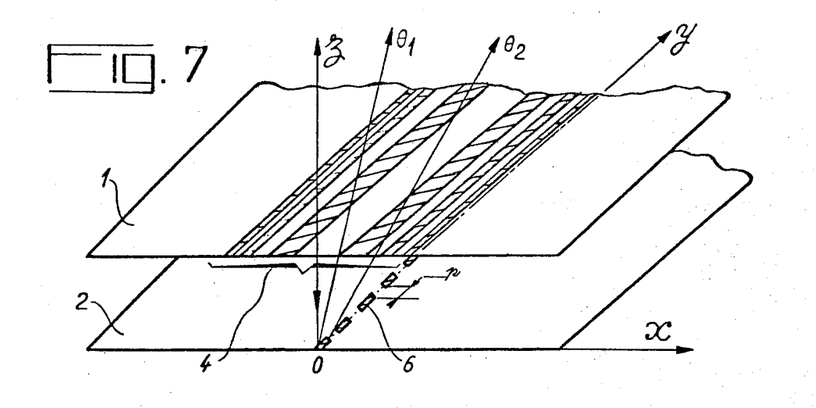
FIG. 7 a second example of the designs inscribed on both mask and pattern for the alignment.

To become free of this constraint another device permitting the separation of the radiation reflected or diffracted by the mask and the useful return radiation emerging from the mask can be used. This device, which uses the diffraction properties of gratings having constant spacings is shown in FIG. 7. The continuous line 3 inscribed on the pattern of FIG. 1 is replaced in FIG. 7 by a broken line 6 in the direction $O_y$ forming a grating of spacing p. The device operates in the following manner. The parallel radiation is incident perpendicularly (or obliquely) on mask 1 and forms on pattern 2 an elongated rectangular light spot in direction $O_y$ corresponding to the direction of the line. The radiation received in this way by the line is reflected in accordance with order O of the grating formed by the line and diffracted in accordance with directions of the plane yoz forming with the axis Oz angle $\theta n$ such that sin $\theta n = \lambda/P$, being the diffraction order and on the corresponding deviation angle. In each of these diffraction directions detection means make it possible to detect a maximum when the light spot and the interrupted line are aligned. As these directions are oblique with respect to the incident beam the return radiation does not interact with the radiation reflected by the mask.

Figure 8:
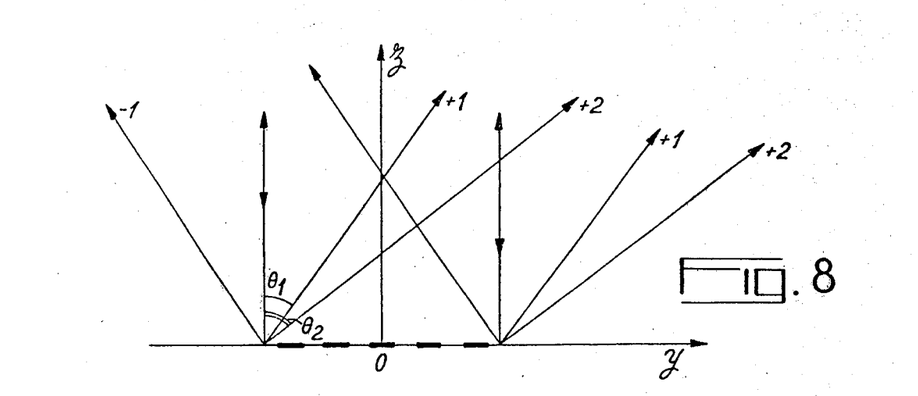
FIG. 8 an explanatory diagram.

FIG. 8 shows the radiation diffracted by the interrupted line in plane yoz.

Order +1, diffracted in the plane yoz is incident obliquely on the lens with Fresnel zones. As the diffracted source of light is in the focal plane of the lens the radiation emerges from the lens in the form of a parallel beam oblique with respect to the lens axis.

In the embodiment shown in FIG. 7 the broken line forming a constant spacing grating is in the form of zones having different reflection coefficients obtained by depositing through a mask a compound which is more or less reflecting than the actual pattern.

Figure 12:
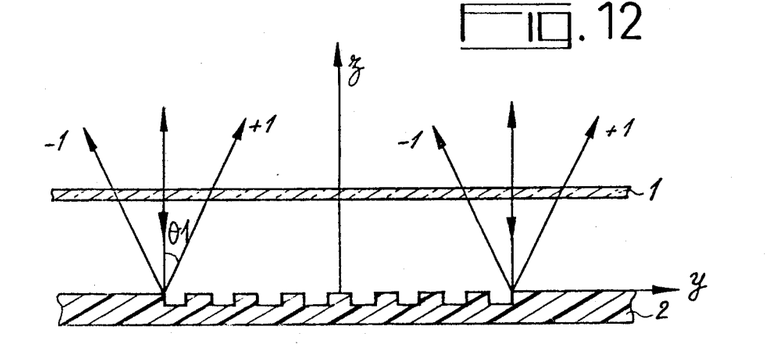
FIG. 12 a sectional view of a pattern mark formed by relief variations.

A reflecting grating making it possible to deflect the return beam can also be obtained by forming a reflecting phase grating by varying the periodic relief of a calculated constant depth along a line extending in direction Oy. FIG. 12 shows such a mark on a section following Oy of pattern 2. Such a relief mark can be obtained by direct etching of the semiconducting substrate (by chemical, ionic or plasma action). Such a mark can have a greater resistance and strength than a deposit of limited thickness made on a flat surface of the pattern and can also be more easy to preserve. In certain cases this makes it possible to have a permanent pattern mark created during the first masking operation, said mark subsequently being used for alignment for all the following masking levels.

The optical alignment method by means of a design forming a lens with Fresnel zones on the mask and a line on the pattern readily lends itself to automatic alignment. To this end it is necessary to alternately scan the rectangular illumination spot on the pattern either by moving the pattern with respect to said spot or by moving the spot on the pattern, the mask being fixed.

The alternating displacement of the pattern along the alignment axis Ox can be obtained by means of a piezoelectric transducer controlled by an alternating signal acting in direction Ox. The return radiation is then detected by a photomultiplier supplying an output signal of variable amplitude applied to one input of a synchronous detector which also receives a synchronous signal of the control signal applied to the piezoelectric transducer. The detector supplies an error signal which can be superimposed on the alternating control signal applied to the piezoelectric transducer in order to displace the scanning centre or can be applied to a displacement device in accordance with Ox of the masking plane. The scanning amplitude is progressively reduced to zero when alignment is performed.

The alternating displacement of the light spot in the plane of the pattern can be obtained for example by a vibrating mirror placed on the radiation path in such a way as to modify the parallel angle of incidence of the beam on the mask in plane xoz, whilst remaining within the limits which maintain the focussing properties of the Fresnel lens. Thus, on emerging from the lens formed on the mask the beam converges on the pattern following a light spot scanning a segment of axis Ox.

Figure 9:
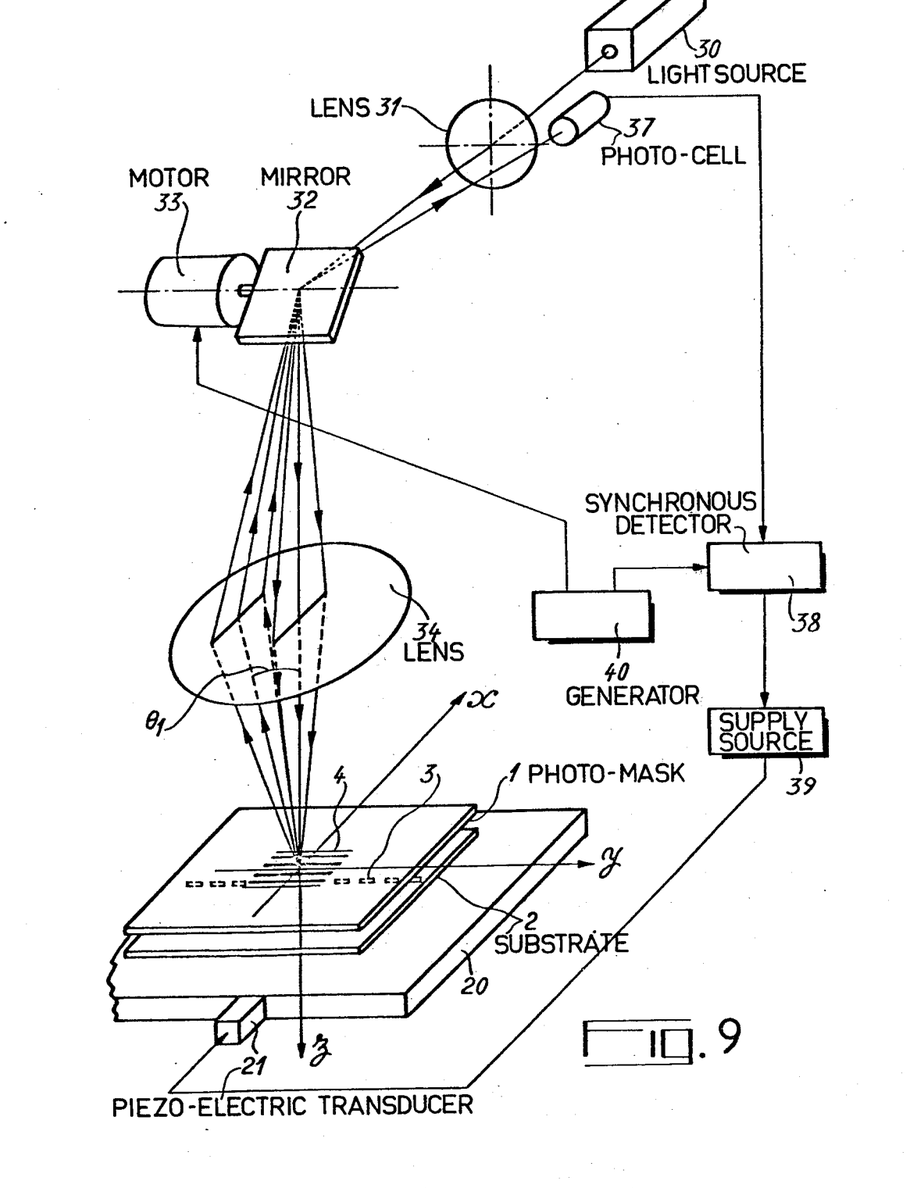
FIG. 9 a diagram of the optical alignment apparatus according to the invention.

FIG. 9 shows an overall diagram of an automatic alignment apparatus in which the line inscribed on the pattern is periodically interrupted, to deflect the return radiation in a different direction, in plane yoz of the incidence direction, as explained with reference to FIG. 7 and in which a vibrating mirror varies the incidence angle of the parallel beam on the Fresnel lens. The apparatus comprises a table 20 on which is placed pattern 2. The table can be moved in accordance with Ox, Oy and in rotation. The drawing only shows piezoelectric transducer 21 which controls the displacement in accordance with Ox. Mask 1 is placed in a not shown mask-holder in a plane parallel to the plane of the table and therefore of the pattern and at a distance of approximately 10 $\mu$m.

A broken line 3 has previously been inscribed on the pattern and a lens 4 with linear Fresnel zones has previously been inscribed on mask 1.

The apparatus also comprises a light source 30, which emits in operation a monochromatic light beam parallel to the direction of condenser lens 31. The beam which emerges from this lens is a convergent beam and only its optical axis is shown. A vibrating mirror 32, controlled by a motor 33 energised by a generator 40, is positioned in such a way that the mirror pivoting axis intersects the optical axis of the incident beam. The beam is reflected by mirror 32 towards a lens 34 and the beam from said lens 34 is a parallel beam having a variable incidence on the mask, but which still illuminates the same mask zone, i.e. the zone in which is inscribed the Fresnel lens which serves as a mark. Only the optical axes of the various beams emerging from mirror 32 are illustrated. Each line represents a particular parallel beam according to different positions of the mirror. These beams impinge onto lens 34 along a line parallel to x. To this end the impact zone of the radiation on mirror 32 is conjugate with the marking zone on the mask with respect to lens 34. Moreover, in order that the beam emerging from the lens is parallel lens 31 and lens 34 form an afocal system. The optical axis of the beam from mirror 32 is shown for two extreme positions and for the central pivoting position of the mirror. The Fresnel lens focusses the radiation and forms on the pattern a light spot which oscillates on either side of a central position on axis Ox. Due to the fact that the mark on the pattern is a broken line, the radiation reflected by the pattern is deflected into the plane yoz of the previously defined angle $\theta_1$ for diffraction order 1. The optical axis of the diffracted radiation is shown for the three above-mentioned incidence directions. This radiation emerges from the lens as a parallel beam, passes through the lens, is reflected by mirror 32 and passes through lens 31. The impact area of the return radiation on lens 34 differs from the impact area of the incident radiation and the same applies with regard to lens 31. Consequently the return radiation emerging from said lens has an optical axis differing from that of the incident radiation, so that the two beams are spatially separated. The return beam is intercepted by a photomultiplier 37 which supplies a signal whose amplitude varies with the relative position of the mask and the pattern and with the position of vibrating mirror 32. The signal obtained is applied, with the alternating control signal applied to motor 33 (or an uneven harmonic of this signal), to a synchronous detector 38 supplying an error signal, which is zero when the aligned position is reached. This error signal is then applied to the power source 39 of piezoelectric transducer 21 in order to apply to the pattern a displacement in accordance with Ox, such that the error signal is progressively reduced to zero. This modulation of the incidence angle of the beam in the mask can be obtained throughout the exposure period in order to make up for the untimely or premature displacements of the pattern with respect to the mask.

Figure 10A:
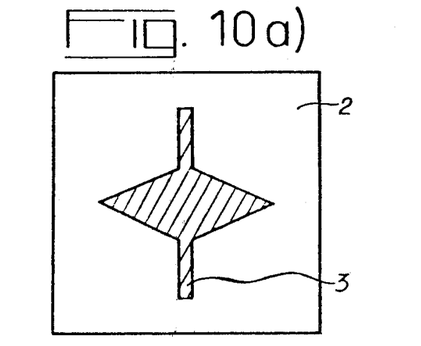
FIGS. 10a and 10b marks made in the plane of the pattern making it possible to obtain an approach signal.
Figure 10B:
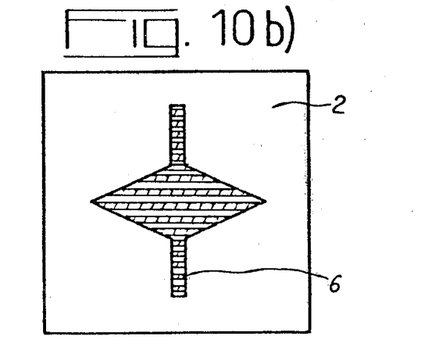

As the line width is small when the light spot whose width is substantially the same as that of the marking line is completely outside said line the error signal level is constant and gives no information on the displacement direction to be effected. To obtain information on the approach it is possible to make a line on the pattern, to which is added in direction Ox zones having the same reflection coefficient as the line in order to start a change in the level of the detected signal when the light zone approaches the line. For example the design mark can have the form shown in FIG. 10. FIG. 10a corresponds to the continuous line of FIG. 1, to which are added reflecting zones for the approach, whilst FIG. 10b corresponds to the broken line of FIG. 7, to which are also added lateral reflecting zones permitting the approach.

FIG. 9, which shows the whole system, has been limited to a displacement in accordance with Ox. To obtain a complete alignment it is possible to inscribe two further lenses with Fresnel zones on the pattern and the lines thereof are parallel to Ox, together with a corresponding line on the pattern parallel to Ox in such a way as to effect the alignment in accordance with direction Oy and the alignment in rotation.

Figure 11:
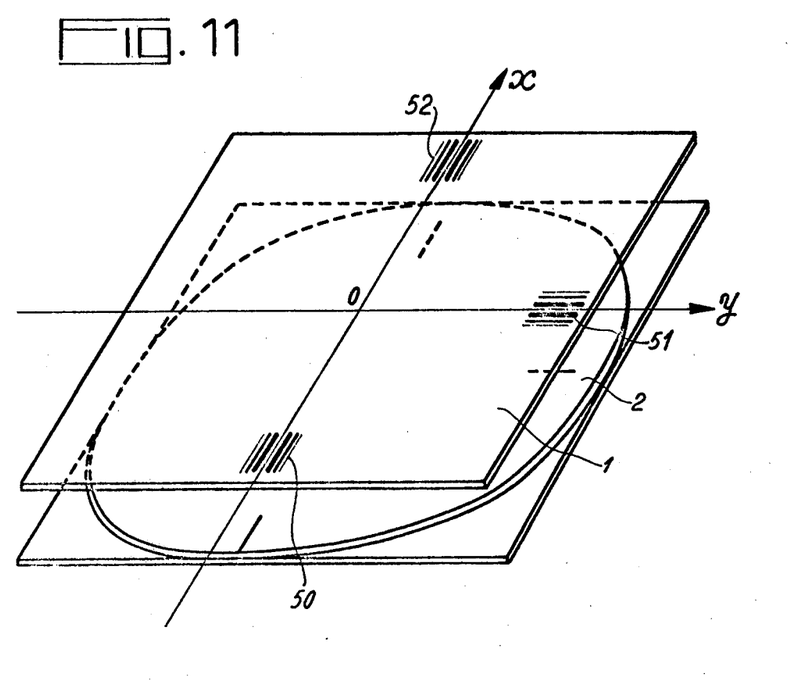
FIG. 11 a view in the plane of the mask of a system of marks permitting the complete alignment of the pattern.

FIG. 11 shows a system of marks permitting the complete alignment of the pattern. In this plane there are three zones of marks 50, 51 and 52 in which have been inscribed lenses with Fresnel zones.

In zones 50 and 52 the strips are parallel to Ox and in zone 51 the strips are parallel to Oy. This arrangement, in which the strips of the Fresnel zones and the corresponding lines on the pattern are arranged in substantially radial directions, is of particular interest when the pattern is exposed through the mask to X-radiation, because the latter is slightly divergent and the design is slightly radially deformed, but the positioning is not affected.

These three mark zones make it possible to align the pattern in x, in y and in rotation.

The invention is not limited to the alignment method and to the embodiments of the alignment apparatus described hereinbefore. In particular for increasing the level of the detected signals it is possible to inscribe a plurality of lenses with parallel linear Fresnel zones in a mask area of a 1/100 μm, whilst inscribing the corresponding lines on the pattern. Thus, the detected radiation is greater. The lens with Fresnel zones can also be limited to a single line representing the central zone, which facilitates the construction of the lens, but the accuracy obtained is slightly less. Moreover, the lens shown in FIG. 1 has a central opaque zone and the lens shown in FIG. 7 has a central transparent zone, but in practice the second arrangement may be preferable with a view to increasing the signal-to-noise ratio.

The alignment method according to the invention makes it possible to obtain a mask-pattern alignment with a precision better than 0.1 μm.

What is claimed is:

1. A method for optically aligning designs in first and second near or close planes using marks inscribed on the two planes to be aligned comprising the steps of:
   inscribing a mark on the first plane including at least one lens having linear Fresnel zones which are alternately opaque and transparent and perpendicular to the alignment axis in the plane,
   inscribing a reflecting mark comprising a single elongated area on the second plane having a central zone perpendicular to the alignment axis, such that the central zone thereof is formed from elements having different reflection coefficients in the direction perpendicular to the alignment direction to form a reflecting amplitude mark with constant spacings in said direction,
   illuminating by a parallel mono-chromatic light beam the lens having linear Fresnel zones in such a way as to form in the second plane a light line having substantially the same dimensions as the central zone of the mark inscribed on said plane, the focal length of said lens corresponding to its principal focus of order 1, the distance separating said first and second planes being chosen equal to the focal length of the lens,
   detecting the radiation reflected by said second plane and emerging from the lens having linear Fresnel zones, and
   displacing the two planes with respect to one another and in the direction of the alignment axis until the detected radiation passes through an extremum corresponding to the alignment of the two marks.

2. A method for optically aligning designs in first and second near or close planes using marks inscribed on the two planes to be aligned comprising the steps of:
   inscribing a mark on the first plane including at least one lens having linear Fresnel zones, which are alternatively opaque and transparent and perpendicular to the alignment axis in the plane,
   inscribing a reflecting mark comprising a single elongated area on the second plane having a central zone perpendicular to the alignment axis the central zone being etched to form a reflecting phase grating with constant spacings extending in the direction perpendicular to the alignment direction,
   illuminating by a parallel mono-chromatic light beam the lens having linear Fresnel zones in such a way as to form in the second plane a light line having substantially the same dimensions as the central zone of the mark inscribed on said plane, the focal length of said lens corresponding to its principal focus of order 1, the distance separating said first and second planes being chosen equal to the focal length of the lens,
   detecting the radiation reflected by said second plane and emerging from the lens having linear Fresnel zones, and
   displacing the two planes with respect to one another and in the direction of the alignment axis until the detected radiation passes through the extremum corresponding to the alignment of the two marks.

3. An apparatus for the optical alignment of designs in two or close planes, comprising:

a mask, a pattern, a monochromatic light source, an optical device for projecting radiation from said source in the form of a parallel beam onto the mask, a design forming at least one lens with linear Fresnel zones being inscribed in the form of opaque and transparent zones on the mask, a design having a central reflecting zone parallel to the lens zones being inscribed on the pattern to be aligned with the mask, means for displacing the pattern with respect to the mask in accordance with an axis orthogonal to the central zone inscribed to bring about coincidence between the light mark formed by the beam of order 1 diffracted by the lens with linear Fresnel zones and the central zone of the design inscribed on the pattern, and a detector for detecting radiation reflected by the pattern, the coincidence corresponding to a signal extremum, wherein the central zone of the design inscribed on the pattern forms a reflecting grating of constant spacing, the radiation received by said grating being diffracted in the plane formed by the optical axis of the incident beam and the grating, the detector being located in the axis of the beam corresponding to one of the diffraction orders, oblique with respect to the incident radiation axis.

4. An alignment apparatus according to claim 3, wherein the detector is positioned in accordance with the optical axis of the beam of order 1 diffracted by the reflecting grating of constant spacing.

* * * * *